(12) United States Patent
Chen et al.

(10) Patent No.: US 11,385,257 B2
(45) Date of Patent: Jul. 12, 2022

(54) APPARATUS FOR TESTING ELECTRONIC COMPONENTS

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Jun Chen, Shenzhen (CN); Wei Wu, Zhengzhou (CN); Yan-Fang Yan, Zhengzhou (CN); Zhen-Ke Zhang, Zhengzhou (CN); Zhi-Qing Liu, Taoyuan County (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 143 days.

(21) Appl. No.: 16/908,999

(22) Filed: Jun. 23, 2020

(65) Prior Publication Data

US 2021/0349128 A1 Nov. 11, 2021

(30) Foreign Application Priority Data

May 8, 2020 (CN) .......................... 202010379826.9

(51) Int. Cl.
*G01R 1/04* (2006.01)
*G01R 1/067* (2006.01)
*G01R 1/073* (2006.01)
*G01R 31/00* (2006.01)

(52) U.S. Cl.
CPC ....... *G01R 1/0408* (2013.01); *G01R 1/07307* (2013.01); *G01R 31/00* (2013.01)

(58) Field of Classification Search
CPC .......... G01R 1/04; G01R 1/067; G01R 1/073; G01R 31/00
See application file for complete search history.

(56) References Cited

U.S. PATENT DOCUMENTS 5,151,651 A * 9/1992 Shibata .................... G01R 1/04
324/750.22

* cited by examiner

*Primary Examiner* — Neel D Shah
(74) *Attorney, Agent, or Firm* — ScienBiziP, P.C.

(57) ABSTRACT

An apparatus for testing electronic components includes a base, a screw rod structure, a first sliding portion, a second sliding portion, a vacuum-based or similar adsorption structure, and a probe. The screw rod structure is fixedly connected to one side of the base. The first sliding portion is slidably positioned on the screw rod structure. The second sliding portion is slidably positioned on the first sliding portion. The adsorption structure is arranged on the second sliding portion. The adsorption structure gathers and holds an electronic component. The probe and the electronic component are arranged to correspond. The probe is electrically connected to a test device. The test device tests the electronic component through the probe.

16 Claims, 5 Drawing Sheets

APPARATUS FOR TESTING ELECTRONIC COMPONENTS

FIELD

The subject matter herein generally relates to electronic component testing apparatus.

BACKGROUND

Many different specifications of electronic components need to be tested, correct electronic components are required for effective circuit performance. Qualifying electronic components may be selected through an organization administering tests, but the structure of traditional test institutions is relatively complicated and the cost is relatively high.

Therefore, improvement is desired.

BRIEF DESCRIPTION OF THE DRAWINGS

Implementations of the present disclosure will now be described, by way of embodiments, with reference to the attached figures.

DETAILED DESCRIPTION

Figure 1:
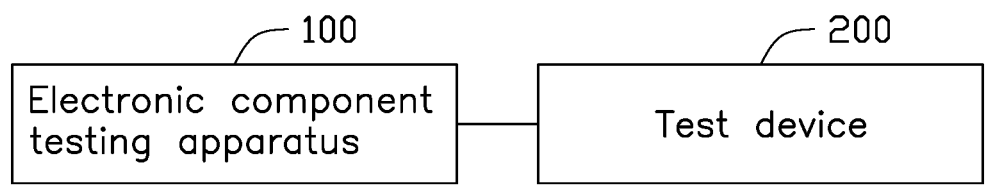
FIG. 1 is a schematic diagram of an embodiment of an apparatus for testing electronic components of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 2:
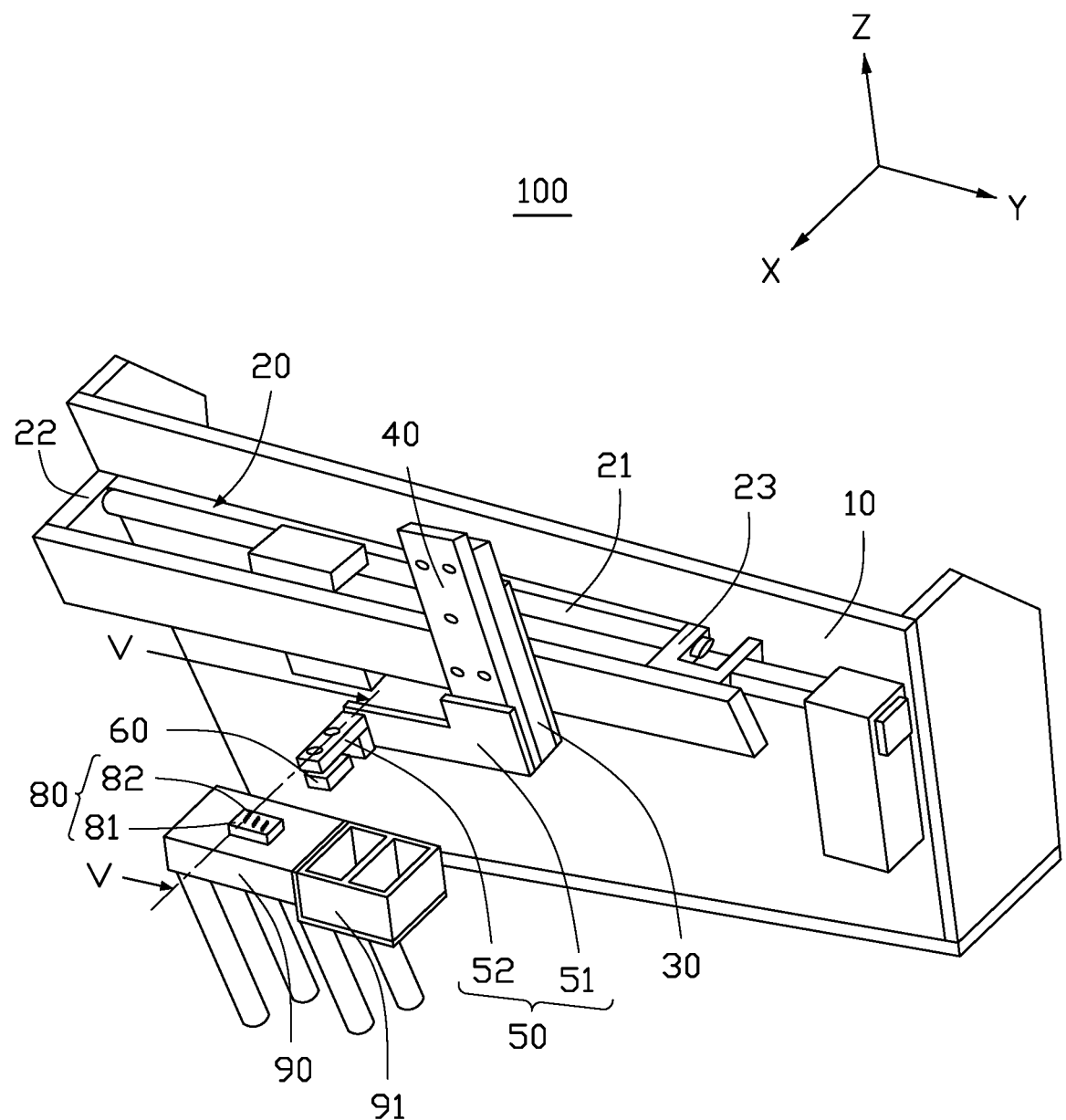
FIG. 2 is a schematic diagram of another embodiment of an apparatus for testing electronic components of the present disclosure.
Figure 3:
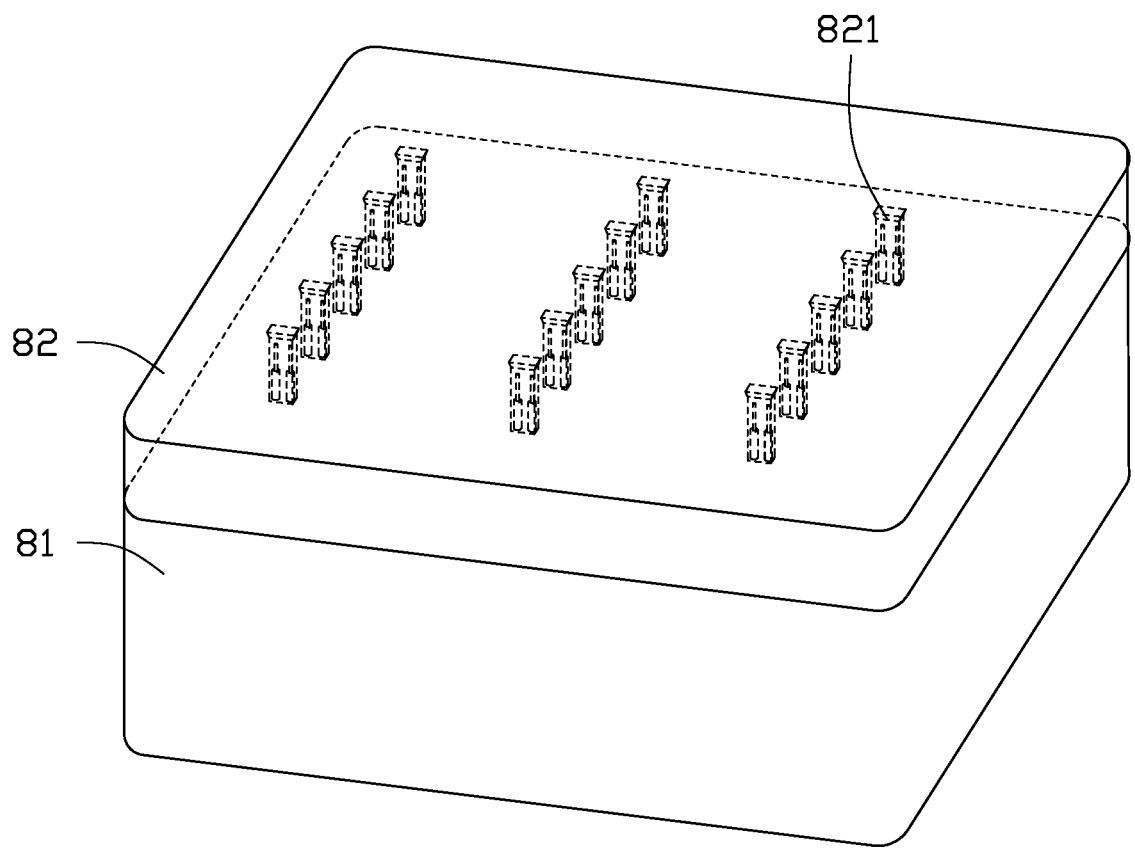
FIG. 3 is a schematic diagram of an embodiment of a testing member of the apparatus of FIG. 2.

FIGS. 1-3 illustrate an electronic component testing apparatus 100 in accordance with an embodiment of the present disclosure. The electronic component testing apparatus 100 is electrically coupled to a test device 200.

Figure 4:
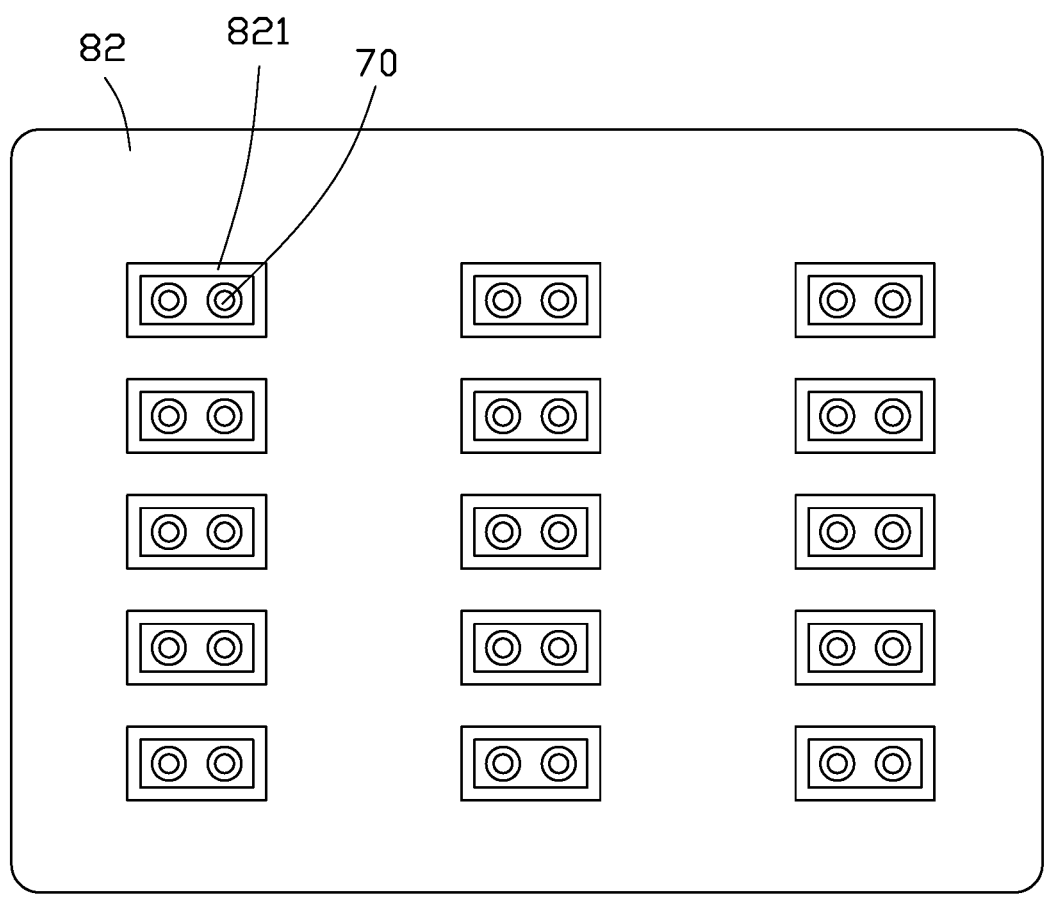
FIG. 4 is a schematic diagram of a guiding hole and a probe of the testing member of FIG. 3 at another angle.

The electronic component testing apparatus 100 includes a base 10, a screw rod structure 20, a first sliding portion 30, a second sliding portion 40, a connecting portion 50, an adsorption structure 60, and a probe 70 (shown in FIG. 4).

Figure 5:
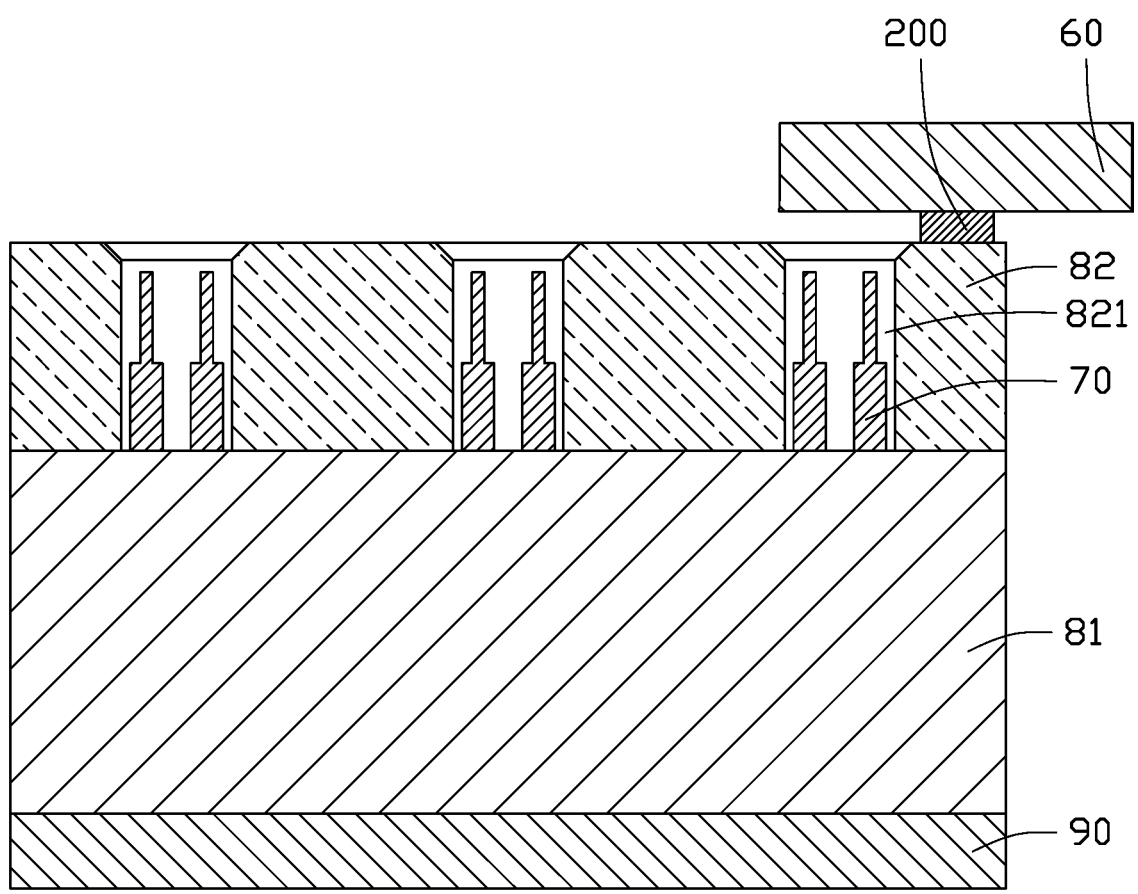
FIG. 5 is a cross-sectional view taken along line V-V of FIG. 2.

The screw rod structure 20 is fixedly connected to one side of the base 10, the first sliding portion 30 is slidably disposed on the screw rod structure 20, the second sliding portion 40 is slidably disposed on the first sliding portion 30, the connecting portion 50 is fixedly connected to the second sliding portion 40, and the adsorption structure 60 is disposed on the connecting portion 50 to gather and hold an electronic component 200 (shown in FIG. 5). The probe 70 corresponds to the electronic component 200 and is electrically connected to the test device 200, the test device 200 can test the performance of the electronic component 200 through the probe 70.

In the embodiment, the base 10 has a half-frame structure. The screw rod structure 20 is substantially plate-shaped, and the screw rod structure 20 is disposed on one side of the base 10. The screw rod structure 20 includes a screw rod 21. The screw rod 21 is connected to a motor (not shown) for moving in a first direction, for example, the Y-axis direction.

In the embodiment, the screw rod structure 20 further includes a first limiting portion 22 and a second limiting portion 23. Ends of the screw rod 21 are connected to the first limiting portion 22 and the second limiting portion 23. The first limiting portion 22 and the second limiting portion 23 prevent the screw rod 21 from disengaging from the screw rod structure 20.

The first sliding portion 30 has a structure substantially plate-like. The first sliding portion 30 is placed vertically, and one side of the first sliding portion 30 is connected to the screw rod 21. When the screw rod 21 is moved by the motor, the first sliding portion 30 also moves along the first direction with the screw rod 21.

The second sliding portion 40 has a rectangular and plate-like structure. The second sliding portion 40 is placed vertically, and one end of the second sliding portion 40 is mounted to slide on the side of the first sliding portion 30 away from the screw rod structure 20.

In the embodiment, the second sliding portion 40 is also connected to a driving structure (not shown). The second sliding portion 40 moves in a second direction, for example, the Z-axis direction, relative to the first sliding portion 30.

The connecting portion 50 is substantially L-shaped. The connecting portion 50 includes a first connecting portion 51 and a second connecting portion 52. The first connecting portion 51 and the second connecting portion 52 are detachably connected, fixedly connected, or integrally formed. When one side of the first connecting portion 51 is connected to an end of the second connecting portion 52, a right angle is formed between the first connecting portion 51 and the second connecting portion 52.

The first connecting portion 51 has a substantially sheet-like structure. One side of the first connecting portion 51 is fixedly connected to a side of the second sliding portion 40 away from the first sliding portion 30, and other side of the first connecting portion 51 is fixedly connected to the end of the second connecting portion 52.

The second connecting portion 52 is a block which is substantially rectangular in shape. The second connecting portion 52 fixedly connects to the adsorption structure 60. In the embodiment, the second connecting portion 52 is fixed to the adsorption structure 60 by screws.

When the screw rod 21 moves, the first sliding portion 30 and the second sliding portion 40 are driven in the first direction. When the second sliding portion 40 moves relative to the first sliding portion 30, the connecting portion 50 can be driven to move in the second direction, thereby adjusting the position of the adsorption structure 60 disposed on the connecting portion 50.

The adsorption structure 60 adsorbs and holds the electronic component 200. In the embodiment, the adsorption structure 60 may be a vacuum chuck.

FIG. 4 illustrates that the electronic component testing apparatus 100 further includes a testing member 80.

The electronic component testing apparatus 100 further includes a measuring platform 90 (shown in FIG. 5). The testing member 80 includes a fixing board 81 and a mounting board 82. The fixing board 81 is disposed on the measuring platform 90. The mounting board 82 has a substantially rectangular parallelepiped shape, and is disposed on the fixing board 81. The mounting board 82 defines a guiding hole 821 for accommodating a plurality of the probes 70.

The probes 70 is received in the guiding hole 821 and is slightly lower than an end of the guiding hole 821 away from the mounting board 82. The probe 70 is disposed in the guiding hole 821, and one end of the probe 70 is electrically connected to the test device (not shown). When the adsorption structure 60 drives the electronic component 200 to move against the probe 70, the probe 70 establishes an electrical connection between the electronic component 200 and the test device, and the test device performs tests on the electronic component 200 through the probe 70.

In the embodiment, the end of the guiding hole 821 away from the mounting board 82 is open. Therefore, it is easier to guide the electronic component 200 to enter the guiding hole 821, and then contact the probe 70 and test the electronic component 200 through the test device.

In the embodiment, the mounting board 82 is made of transparent material. Therefore, the pins of the electronic component 200 can be observed as to contact with the probe 70, and after the pins of the electronic component 200 are in contact with the probe 70, the test device can run the tests through the probe 70.

In the embodiment, a parabolic box 91 is also provided on the measuring platform 90. The parabolic box 91 has a rectangular parallelepiped shell shape with one end open. The parabolic box 91 receives the electronic component 200 after testing.

Referring to FIG. 5, in use, the adsorption structure 60 adsorbs the electronic component 200. The motor moves the screw rod 21 in the first direction, and drives the first sliding portion 30, the second sliding portion 40, the connecting portion 50, and the adsorption structure 60 to move in the first direction together, to adjust the position of the adsorption structure 60 in the first direction. The electronic component 200 adsorbed by the adsorption structure 60 is aligned with the probe 70. Then, the driving structure moves the second sliding portion 40 in the second direction relative to the first sliding portion 30, and drives the connecting portion 50 and the adsorption structure 60 to move in the second direction together, to adjust the position of the adsorption structure 60 in the second direction. For example, the adsorption structure 60 can be moved downward to a designated position for the probe 70 to achieve contact with the pins of the electronic component 200. Thus, the test device can test the electronic component 200 through the probe 70.

After the test, the driving structure moves the second sliding portion 40 in the second direction relative to the first sliding portion 30, and moves the connecting portion 50 in the second direction together, for example, the adsorption structure 60 can be moved upward until the electronic component 200 on the adsorption structure 60 is separated from the guiding hole 821. The motor moves the screw rod 21 along the first direction, and moves the first sliding portion 30, the second sliding portion 40, and the connecting portion 50 along the first direction together to adjust the position of the adsorption structure 60 in the first direction. Thus, the electronic component 200 can be aligned with the parabolic box 91, so the tested electronic component 200 can be released to the parabolic box 91.

In the embodiment, the testing device includes a display unit (not shown). The display unit is used to display the test results of the electronic component 200.

In the embodiment, the electronic component testing apparatus 100 may further include a material tray (not shown) for accommodating a plurality of the electronic components 200. In the embodiment, the electronic components 200 can be divided into several portions, each portion having the same amount, and the portions of the electronic components 200 are received in a corresponding material tray. Random sampling and testing can be carried out, for example, randomly detecting the performance of the plurality of the electronic components 200 from one of the material trays, it can be understood whether all the electronic components 200 in the material tray can be applied to the circuit.

For example, the adsorption structure 60 can adsorb three electronic components 200 from the material tray, and test the electronic components 200 in the above-described manner. When the test condition of at least one of the electronic components 200 is good, it is determined that the electronic components 200 in the corresponding material tray have good performance and can be applied to a circuit. In other embodiments, the number of the electronic components 200 gathered by the adsorption structure 60 from the material tray is not limited to three, the number can be adjusted according to specific circumstances, for example, two, four, or more of the electronic components 200.

In the embodiment, the mounting board 82 may defines a plurality of the guiding holes 821 to accommodate different sizes, different distances, and different numbers of the probes 70, to adapt to the testing of various electronic components of different sizes.

The electronic component testing apparatus 100 can be widely used to detect electronic components of different sizes. Furthermore, the electronic component testing apparatus 100 can apply many tests to the electronic components. Its structure is simple, and the cost is low, and it is easy to manufacture.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the exemplary embodiments described above may be modified within the scope of the claims.

What is claimed is:

1. An electronic component testing apparatus comprising:
 a base;

a screw rod structure coupled to one side of the base;
a first sliding portion disposed on one side of the screw rod structure;
a second sliding portion slidably disposed on the first sliding portion;
an adsorption structure disposed on the second sliding portion; wherein the adsorption structure attracts an electronic component; and
a probe electrically coupled to a testing device;
wherein the probe is arranged corresponding to the electronic component, and the test device tests the performance of the electronic component through the probe; and
wherein the electronic component testing apparatus further comprises a testing member, the testing member comprises a mounting board, the mounting board defines a plurality of guiding holes, the probe is received in each of the plurality of guiding holes, and the probe is slightly lower than an end of the guiding hole away from the mounting board.

2. The electronic component testing apparatus according to claim 1, wherein the screw rod structure comprises a screw rod, the screw rod drives the first sliding portion, the second sliding portion, and the adsorption structure to move in a first direction.

3. The electronic component testing apparatus according to claim 2, wherein one end of the second sliding portion is slidably mounted on one side of the first sliding portion away from the screw rod structure, the second sliding portion drives the adsorption structure to move in a second direction.

4. The electronic component testing apparatus according to claim 1, further comprising a connecting portion fixedly connected to the second sliding portion and the adsorption structure.

5. The electronic component testing apparatus according to claim 4, wherein the connecting portion comprises a first connecting portion and a second connecting portion, a first side of the first connecting portion is fixedly connected to one side of the second sliding portion away from the first sliding portion, a second side of the first connecting portion is fixedly connected to an end of the second connecting portion, and another end of the second connecting portion is fixedly connected to the adsorption structure.

6. The electronic component testing apparatus according to claim 1, wherein the adsorption structure is a vacuum chuck.

7. The electronic component testing apparatus according to claim 1, further comprising a measuring platform, wherein the mounting board is disposed on the measuring platform.

8. The electronic component testing apparatus according to claim 7, further comprising a parabolic box disposed on the measuring platform, and used to receive the tested electronic component.

9. The electronic component testing apparatus according to claim 7, wherein the mounting board is made of transparent material.

10. The electronic component testing apparatus according to claim 9, wherein an end of the guiding hole away from the mounting board is open.

11. An electronic component testing apparatus comprising:
a base;
a screw rod structure coupled to one side of the base;
a first sliding portion disposed on one side of the screw rod structure;
a second sliding portion slidably disposed on the first sliding portion;
an adsorption structure disposed on the second sliding portion; wherein the adsorption structure attracts an electronic component; and
a probe electrically coupled to a testing device;
wherein the probe is arranged corresponding to the electronic component, and the test device tests the performance of the electronic component through the probe;
wherein the screw rod structure comprises a screw rod, the screw rod drives the first sliding portion, the second sliding portion, and the adsorption structure to move in a first direction; and
wherein one end of the second sliding portion is slidably mounted on one side of the first sliding portion away from the screw rod structure, the second sliding portion drives the adsorption structure to move in a second direction;
wherein the electronic component testing apparatus further comprises a testing member, a parabolic box and a measuring platform, the testing member comprises a mounting board disposed on the measuring platform; wherein the mounting board defines a plurality of guiding holes, the probe is received in each of the plurality of guiding holes, and the probe is slightly lower than an end of the guiding hole away from the mounting board, the parabolic box is disposed on the measuring platform, and used to receive the tested electronic component.

12. The electronic component testing apparatus according to claim 11, further comprising a connecting portion fixedly connected to the second sliding portion and the adsorption structure.

13. The electronic component testing apparatus according to claim 12, wherein the connecting portion comprises a first connecting portion and a second connecting portion, a first side of the first connecting portion is fixedly connected to one side of the second sliding portion away from the first sliding portion, a second side of the first connecting portion is fixedly connected to an end of the second connecting portion, and another end of the second connecting portion is fixedly connected to the adsorption structure.

14. The electronic component testing apparatus according to claim 11, wherein the adsorption structure is a vacuum chuck.

15. The electronic component testing apparatus according to claim 11, wherein the mounting board is made of transparent material.

16. The electronic component testing apparatus according to claim 15, wherein an end of the guiding hole away from the mounting board is open.

* * * * *